(12) United States Patent
Braceras et al.

(10) Patent No.: US 7,729,159 B2
(45) Date of Patent: *Jun. 1, 2010

(54) APPARATUS FOR IMPROVED SRAM DEVICE PERFORMANCE THROUGH DOUBLE GATE TOPOLOGY

(75) Inventors: George M. Braceras, Essex Junction, VT (US); Wilfried E. A. Haensch, Somers, NY (US); Joseph A. Iadanza, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 27 days.

This patent is subject to a terminal disclaimer.

(21) Appl. No.: 12/146,554

(22) Filed: Jun. 26, 2008

(65) Prior Publication Data

US 2008/0273373 A1    Nov. 6, 2008

Related U.S. Application Data

(63) Continuation of application No. 11/743,686, filed on May 3, 2007, now Pat. No. 7,408,800.

(51) Int. Cl.
*G11C 11/00* (2006.01)
(52) U.S. Cl. .................. 365/154; 365/156; 365/190
(58) Field of Classification Search .................. 365/156
See application file for complete search history.

(56) References Cited

U.S. PATENT DOCUMENTS

| | | | | |
|---|---|---|---|---|
| 3,662,356 A | * | 5/1972 | Michon et al. ............... | 365/154 |
| 3,693,170 A | * | 9/1972 | Ellis et al. ................. | 365/49.11 |
| 5,706,226 A | * | 1/1998 | Chan et al. ................. | 365/156 |
| 5,831,897 A | * | 11/1998 | Hodges ...................... | 365/156 |
| 6,433,609 B1 | | 8/2002 | Voldman | |
| 6,538,916 B2 | | 3/2003 | Ohsawa | |
| 6,580,293 B1 | | 6/2003 | Bernstein et al. | |
| 6,778,424 B2 | | 8/2004 | Iwata et al. | |
| 6,980,461 B2 | | 12/2005 | Portmann et al. | |
| 6,989,706 B2 | | 1/2006 | Sekigawa et al. | |
| 7,042,792 B2 | * | 5/2006 | Lee et al. ............... | 365/230.05 |
| 7,084,461 B2 | | 8/2006 | Anderson et al. | |
| 7,295,459 B2 | * | 11/2007 | Islam ........................ | 365/156 |
| 7,511,989 B2 | * | 3/2009 | Thomas et al. .............. | 365/154 |
| 7,606,062 B2 | * | 10/2009 | Hsu et al. ................... | 365/154 |
| 2006/0227595 A1 | | 10/2006 | Chuang et al. | |

* cited by examiner

*Primary Examiner*—Tan T. Nguyen
(74) *Attorney, Agent, or Firm*—Cantor Colburn LLP; Michael LeStrange

(57) ABSTRACT

A static random access memory (SRAM) device a pair of cross-coupled, complementary metal oxide semiconductor (CMOS) inverters configured as a storage cell for a bit of data, a first pair of transfer gates configured to couple complementary internal nodes of the storage cell to a corresponding pair of bitlines during a read operation of the device; and a second pair of transfer gates configured to couple the storage cell nodes to the pair of bitlines during a write operation of the device, wherein impedance between the bitlines and the storage cell nodes during the write operation is less than that for the read operation, wherein impedance between the bitlines and the storage cell nodes during the write operation is less than that for the read operation.

17 Claims, 5 Drawing Sheets

US 7,729,159 B2

APPARATUS FOR IMPROVED SRAM DEVICE PERFORMANCE THROUGH DOUBLE GATE TOPOLOGY

CROSS-REFERENCE TO RELATED APPLICATION

This application is a continuation of U.S. patent application Ser. No. 11/743,686, filed May 3, 2007 now U.S. Pat. No. 7,408,800, the disclosure of which is incorporated by reference herein in its entirety.

BACKGROUND

The present invention relates generally to integrated circuit memory devices, and, more particularly, to an apparatus and method for improved SRAM device performance through use of a double gate topology.

A typical static random access memory (SRAM) includes an array of individual SRAM cells. Each SRAM cell is capable of storing a binary voltage value therein, which voltage value represents a logical data bit (e.g., "0" or "1"). One existing configuration for an SRAM cell includes a pair of cross-coupled devices such as inverters. With CMOS (complementary metal oxide semiconductor) technology, the inverters further include a pull-up PFET (p-channel) transistor connected to a complementary pull-down NFET (n-channel) transistor. The inverters, connected in a cross-coupled configuration, act as a latch that stores the data bit therein so long as power is supplied to the memory array. In a conventional six-transistor cell, a pair of access transistors or pass gates (when activated by a word line) selectively couples the inverters to a pair of complementary bit lines.

The design of SRAM cells has traditionally involved a compromise between the read and write functions of the memory cell to maintain cell stability, read performance and write performance. The transistors which make up the cross couple must be weak enough to be overdriven during a write operation, while strong enough to maintain their data value when driving a bitline during a read operation. The transfer gates that connect the cross coupled nodes to the true and compliment bitlines affect both the stability and performance of the cell. In one-port SRAM cells, a single pair of transfer gates is conventionally used for both read and write access to the cell. These gates are driven to a digital value to switch the transfer gates between an on and off state. The optimization of a transfer gate for a write operation would drive the reduction of the on-resistance ($R_{on}$) for the device. On the other hand, the optimization of a transfer gate for a read operation drives an increase in $R_{on}$ in order to isolate the cell from the bitline capacitance and prevent a cell disturb.

Accordingly, it would be desirable to be able to optimize the read and write performance of an SRAM device notwithstanding the inherent tradeoff aspects described above, and in a manner that reduces device area while still maintaining cell stability.

SUMMARY

The foregoing discussed drawbacks and deficiencies of the prior art are overcome or alleviated by a static random access memory (SRAM) device. In an exemplary embodiment, the SRAM device includes a pair of cross-coupled, complementary metal oxide semiconductor (CMOS) inverters configured as a storage cell for a bit of data, a first pair of transfer gates configured to couple complementary internal nodes of the storage cell to a corresponding pair of bitlines during a read operation of the device; and a second pair of transfer gates configured to couple the storage cell nodes to the pair of bitlines during a write operation of the device, wherein impedance between the bitlines and the storage cell nodes during the write operation is less than that for the read operation.

In another embodiment, a static random access memory (SRAM) array includes a plurality of SRAM storage cells arranged in rows and columns, each of the storage cells further comprising a pair of cross-coupled, complementary metal oxide semiconductor (CMOS) inverters, a first pair of transfer gates configured to couple complementary internal nodes of the storage cell to a corresponding pair of bitlines during a read and a write operation of the device, and a second pair of transfer gates configured to couple the storage cell nodes to the pair of bitlines only during a write operation of the device, wherein impedance between the bitlines and the storage cell nodes during the write operation is less than that for the read operation. The first and second pairs of transfer gates are each implemented within a single pair of dual gate access transistors configured to selectively couple the storage cell nodes to the pair of bitlines, and the second pair of transfer gates corresponding to the dual gate access transistor is coupled to a back gate write signal, wherein control lines for the back gate write signals are routed in parallel with the cell bitlines.

In still another embodiment, a method for operating a static random access memory (SRAM) device having a pair of cross-coupled, complementary metal oxide semiconductor (CMOS) inverters configured as a storage cell for a bit of data includes: coupling complementary internal nodes of the storage cell to a corresponding pair of bitlines through a first pair of transfer gates during a read operation of the device; and coupling the storage cell nodes to the pair of bitlines through a second pair of transfer gates during a write operation of the device; wherein impedance between the bitlines and the storage cell nodes during the write operation is less than that for the read operation.

BRIEF DESCRIPTION OF THE DRAWINGS

Referring to the exemplary drawings wherein like elements are numbered alike in the several Figures.

DETAILED DESCRIPTION

Disclosed herein is an apparatus and method for improved SRAM performance through the use of dual gate FET technology within the SRAM cell. A dual gate (or back gate) technology, which may be either realized through FINFETs or surface FETs, provides a means for selectively altering the transfer gate performance of the SRAM cell during read and write operations so as to improve stability, performance and write margin.

Figure 1:
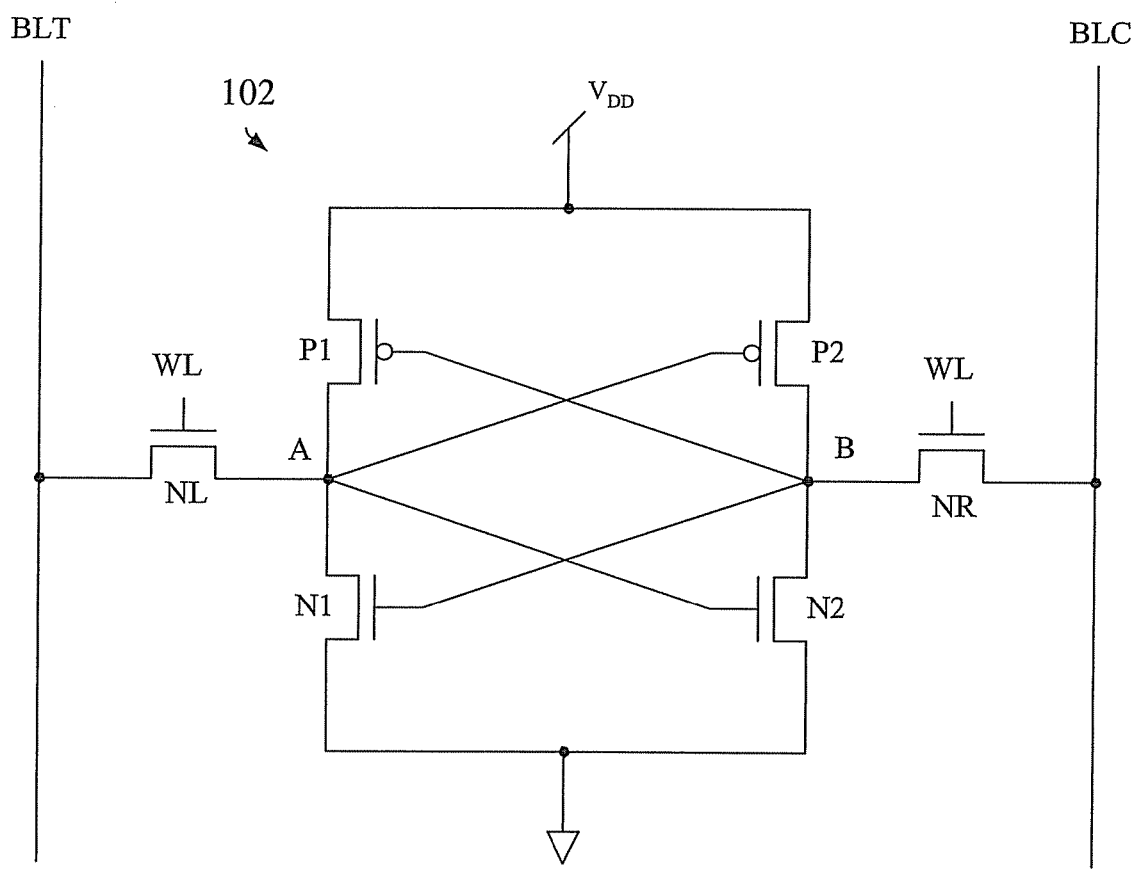
FIG. 1 is a schematic diagram of a conventional, single port SRAM cell structure.

Referring initially to FIG. 1, there is shown a schematic diagram of a conventional SRAM cell structure 100, which represents a single memory cell included within a memory array arranged in rows and columns. The SRAM cell structure 100 includes a six-transistor memory cell 102 that is capable of storing a binary bit of information. Specifically, the memory cell 102 includes a pair of cross-coupled, complementary metal oxide semiconductor (CMOS) inverters. One inverter includes an NFET storage transistor N1 and a PFET load transistor P1. Similarly, a second inverter includes an NFET storage transistor N2 and a PFET load transistor P2.

Transistors P1 and P2 are often referred to as "pull-up" transistors because of their coupling to the voltage source $V_{DD}$. Transistors N1 and N2 are similarly referred to as "pull-down" transistors because of their coupling to ground. The memory cell 102 further contains NFET access transistors (also referred to as "pass gates") NL and NR serving as switches, each of which are coupled between the bistable circuit (P1, N1, P2 and N2) and a pair of true and complementary bit lines BLT and BLC, respectively. Pass gates NL and NR are activated by an appropriate signal generated on a wordline WL.

The ability to write data into and read data from the SRAM cell 102 is achieved through a careful balance of the relative strength of each of the six transistors. For example, the optimization of the design solely for read stability will result in a cell that is either slow or impossible to write. On the other hand, optimization of the design solely for write access performance will result in an SRAM cell that is unstable, in that such a cell may not retain its data state once the wordline turns on. Although stability could be improved without degrading write performance by increasing the pull-down device width, this comes at the expense of increasing the cell area.

The following specific descriptions of exemplary SRAM read and write operations provide further insight into this careful balance. Prior to accessing the SRAM data, the true/complement bitlines (BLT/BLC) are typically precharged to a value such as logic high ($V_{DD}$). A write operation occurs when the wordline drives high to activate transistors NL and NR and access the cell nodes. A differential voltage is developed on the bitline pair (BLT/BLC) and forced onto the internal cell nodes A, B. For example, if the cell is initialized to a logical '1', with cell node B at the supply voltage, the cell is written to a logical '0' by driving BLC to ground and discharging node B through pass gate NR. The pass gate NR needs to be sufficiently strong to allow enough current to overcome PFET P2, which is initially actively holding node B at $V_{DD}$. The activation of NL with BLT at $V_{DD}$ pulls node A high, with the cell resolving the digital '0' with the cross-coupled inverters reinforcing each other's output value. With node B at ground, the cross-coupled inverter will resolve by driving node A high through the inverter combination of P1 and N1. In summary, the cell's write ability is dependent upon the strength of the NFET pass gate devices, relative to the strength of the associated PFET pull up device.

Turning now to a read operation of the SRAM cell, when the cell 102 is read, the precharged bitline that is connected to the "low" cell node (e.g., node B) will begin to discharge towards ground through the associated pass gate (e.g., NR). However, because the bitline capacitance is much higher than that of the cell node, charge sharing through the access transistor NR will cause the voltage of low cell node (B) to initially "bump up" from ground. If the voltage of this node rises high enough to start turning on the "off" side NFET (N1 in this example), positive feedback will occur and the cell may erroneously flip its state. The amount the low node voltage rises from ground is determined by the device strength ratio between the cell's pull-down NFETs (N1, N2) and the access NFETs (NL, NR). The stronger the pull-down device is relative to the access transistor, the less the low node will rise. The term "Beta ratio" refers to the strength of the pull-down device (W/L of the pull-down NFET) relative to the strength of the pass-gate device (W/L of the access NFET). In order to have a stable cell, the Beta ratio needs to be sufficiently large (e.g., about 2:1). On the other hand, in order to keep the cell size as small as possible, a cell designer should not design the pull-down devices to be any larger than necessary to keep the cell stable, thus forcing the pass gate devices to be relatively small, weak devices.

As will thus be seen, the SRAM cell margin is hit from both ends. Whereas a write operation is optimized through a stronger pass gate device, read operations and cell stability considerations are optimized by having the pass gate devices small and weak. With memory technology scaling into the deep submicron regime, such SRAM devices have become extremely small, and subsequently experience significant variability in their individual transistor strengths (primarily driven by the threshold voltage variability). This makes it very difficult, if not impossible, to balance the SRAM cell read and write margin. Thus, what is needed is the ability to modulate the strength of a pass gate NFET such that it becomes stronger for a write cycle, but relatively weaker for a read cycle.

Figure 2:
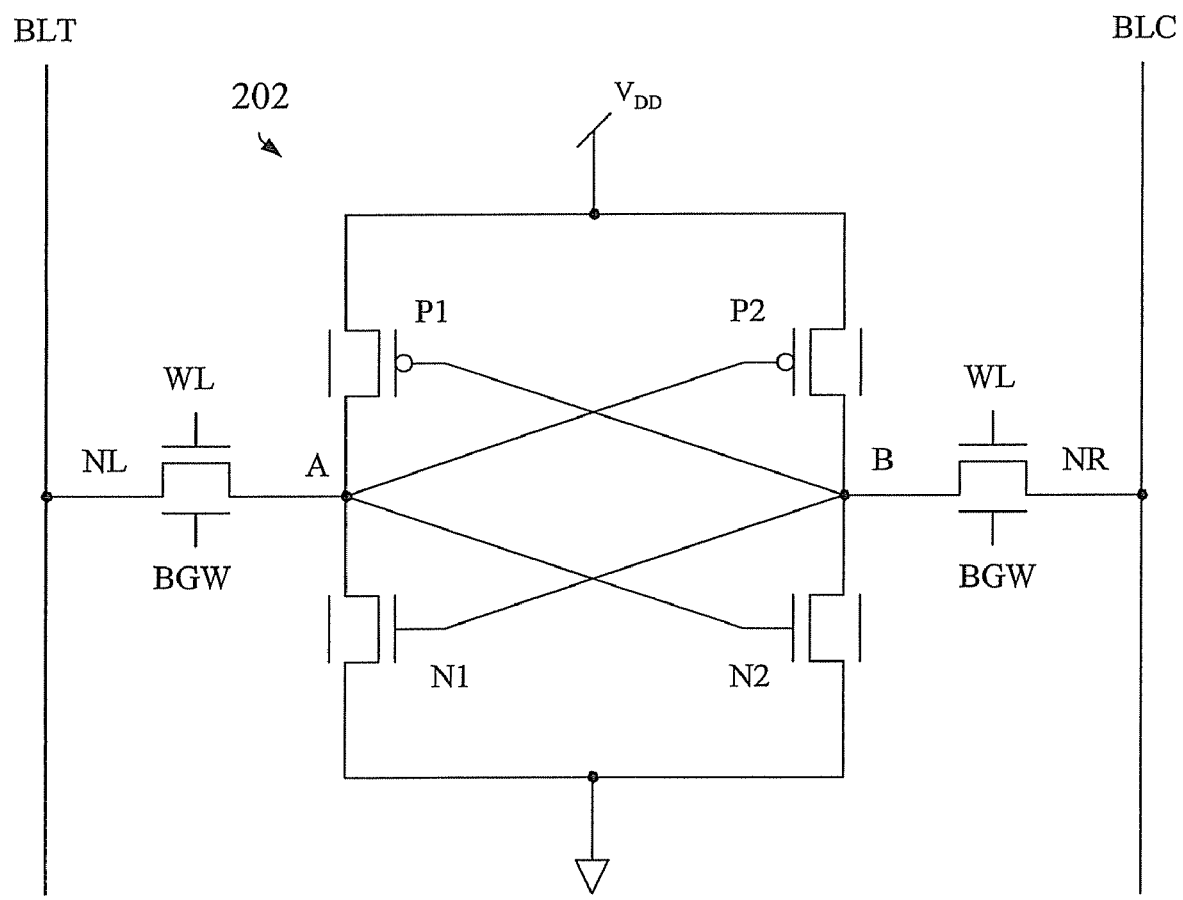
FIG. 2 is a schematic diagram of a double gate SRAM cell structure, in accordance with an embodiment of the invention.

Therefore, in accordance with an embodiment of the invention, FIG. 2 is schematic diagram of a double gate SRAM structure 200 in which the individual transistors of the cell 202 comprise dual gate devices. As particularly shown in FIG. 2, the pass gate devices NL and NR include secondary (back) gates that are isolated from the primary (front) gate, thereby allowing them to be independently controlled by a back gate write signal (BGW). When both front and back gates are simultaneously activated to control the channel, a maximum conductance state results. Where only one gate is active, a channel will still form in the device, although it will be less conductive. For ease of manufacturing, the cross-coupled devices P1, N1, P2, and N2 may also be dual gate devices with the back gate connected to the primary gate. Alternatively, the back gates may be left as open circuits or tied inactive.

Because it is beneficial to have a strong pass gate device for a write operation of an SRAM device, signal BGW is thus driven high along with the wordline signal (WL), thereby providing the pass gates NL, NR with sufficient strength to overcome whichever of the two PFETs (P1, P2) is the one pulling up the cell's high node. However, during a read operation, signal BGW is kept low so as to restrict the channel current of NL and NR, which in turn renders the cell more stable.

In an exemplary embodiment, the back gate signal BGW is digital (i.e., maintained at either at $V_{DD}$ or at ground). Although this configuration provides more optimal write ($V_{DD}$) and stability (ground) margins, the cell's read performance is somewhat compromised; if a cell is made "too stable," the read performance may be unnecessarily degraded. Alternatively, it is possible to control signal BGW in an analog fashion, with the ability to assume any voltage between $V_{DD}$ and ground. On one hand, a write operation will still benefit from setting BGW to $V_{DD}$. However, during a read operation, the signal BGW is lowered, to a voltage level between $V_{DD}$ and ground, only as much as needed to ensure the cell's stability. Read performance will thus be enhanced with respect to a purely digital control of BGW.

Figure 3:
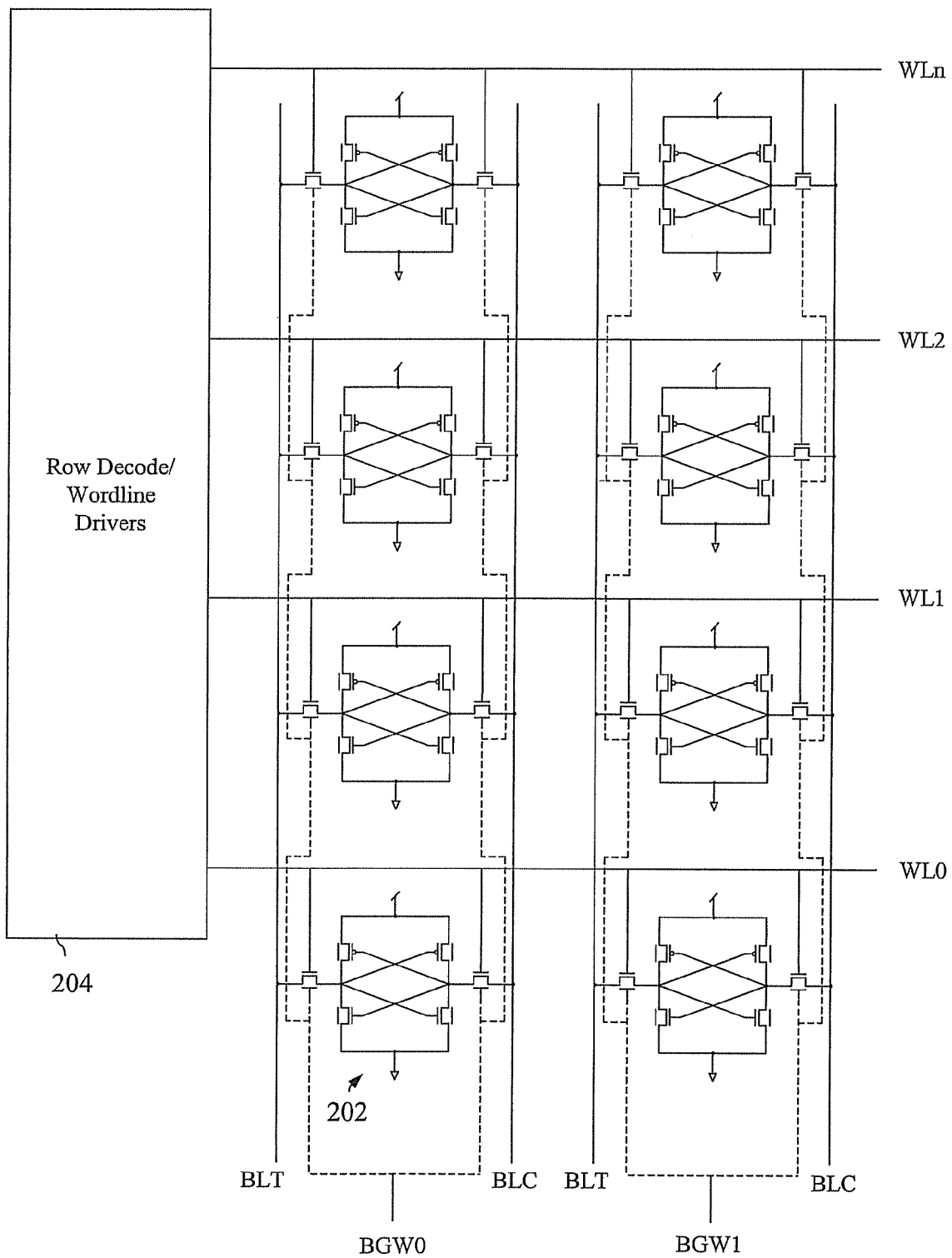
FIG. 3 is a schematic diagram of an array of double gate SRAM cell structures shown in FIG. 2, particularly illustrating the parallel routing of back gate write signals with respect to bitlines, in accordance with a further embodiment of the invention.

In terms of an array layout, control lines for the BGW signals may be routed in parallel with the cell bitlines, as shown in the array of FIG. 3. A plurality of SRAM cells 202 is configured in rows and columns, with the rows corresponding to wordlines (e.g., WL0 ... WLn) driven by row decode/wordline drivers 204. The BGW signals (e.g., BGW0, BGW1), corresponding to the array columns along with the bitline pairs, are driven high for only the cells that are going to be written. In a typical SRAM device, not all cells along a selected wordline or row are written during a given operation. Rather, specific cells are decoded and written along the selected wordline, leaving the remaining cells coupled to the inactive wordlines in a "half-selected" state. In a similar fashion, the back gate control signals BGW0, BGW1 depicted in FIG. 3 will only go active when their respective column is being written. As described in more detail below, the biasing of the back gate control signals in this embodiment would desirably also affect the performance of the front gate (i.e., reduce the pass gate impedance as compared to front gate operation only during a read operation).

Figure 4:
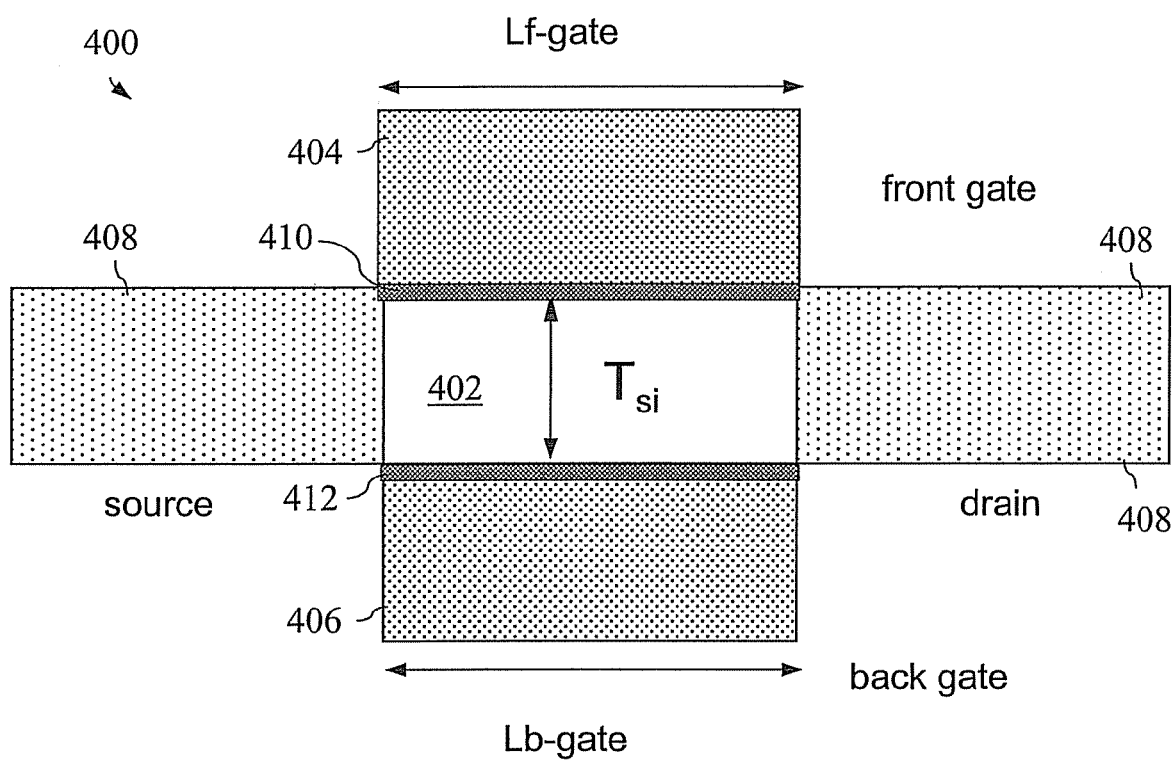
FIG. 4 is a cross-sectional view of a symmetric double gate FET device, having a front gate on one side of the device channel and a back gate on the opposite side of the device channel.

As briefly described above, the modulated pass gate resistance capability of an SRAM device, depending upon a read or write operation, is implemented in an exemplary embodiment through the use of dual gate CMOS processing. Such FETs may be formed in either a FINFET structure or a surface FET structure. Recent advances in semiconductor processing have resulted in the creation of a double gate FET device, an example of which is illustrated in FIG. 4. Although there are a number of different physical implementations of a double gate FET, the basic structure of the double gate FET 400 includes a channel region 402 of thickness $T_{si}$ sandwiched between two gate regions 404, 406 defined by polysilicon over a gate oxide with source/drain diffusions 408 abutting the channel region 402.

Assuming that the channel region 402 of the double gate device 400 is thick enough (and doped in a manner to support two distinct channels through the channel region 402), the double gate FET 402 may be thought of as two independent FETs configured in parallel between the source and drain terminals of the device. Although the length and width of the two "parallel" FET devices is linked, the parametric behavior of the devices need not be. For example, symmetric double gate FETs, such as the one shown in FIG. 4, are characterized by equivalent oxide thicknesses (front gate oxide 410, back gate oxide 412) and gate work functions for both the front and back side FETs, along with symmetric channel doping. Given an adequately thick $T_{si}$ (i.e., greater than the quantum limit of about 4 nm), two distinct channels of equal strength/conductivity are possible through the channel region 402 of the double gate device 400. A combination of doping density and the thickness ($T_{si}$) of the body determine whether the FET operates in a fully depleted (FD) mode, or a partially depleted (PD) mode. A thicker $T_{si}$ and higher body doping place the FET 400 in the PD mode while thinner body thickness and/or low body doping result in FD operation.

Generally, the schematic cell diagram illustrated in FIG. 2 contemplates the use of both thick and thin $T_{si}$ devices. However, in terms of the FIG. 3 embodiment discussed above, thinner $T_{si}$ devices are desirable such that the bias on the back gate voltage affects the front gate performance. That is, the double gate transistors used for the pass gate devices in FIG. 3 comprise a single channel body operating in a fully depleted mode.

Asymmetric gates, characterized by two conductive channels of unequal strength or conductivity, are also possible within current double gate technology. For example, an asymmetry between the front and back gate results in a difference in inversion carrier density (electron density for NFETs, hole density for PFETs) for the two channels, as well as a difference in IV curves for the front and back channel devices. Whereas a symmetric dual gate structure is characterized by two "parallel" FETs with equivalent gate work functions, oxide thicknesses, and uniform doping on the channel region (which results in equal strength or conductivity for the two transistors comprising the double gate FET), there are several ways to achieve asymmetry in a double gate FET by altering one or more of a number of parameters that affect the threshold voltage/strength/conductivity of the front or back side device relative to its counterpart.

Figure 5:
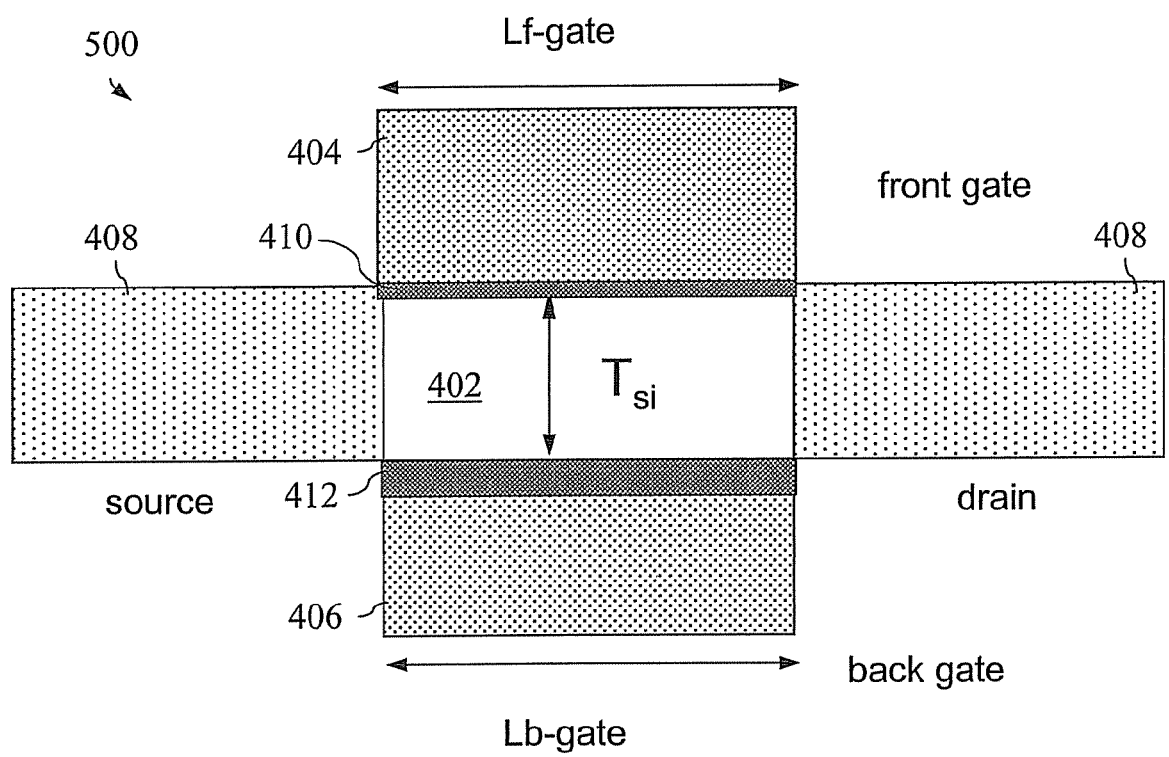
FIG. 5 is a cross-sectional view of one example of an asymmetric double gate FET device suitable for use in accordance with an embodiment of the invention.

FIG. 5 illustrates one such example of an asymmetric dual gate FET structure 500, in which the thickness of the back gate oxide 412 is greater than that of the front gate oxide 420. However, several alternatives exist for producing asymmetric dual gate FET structures, including but not limited to: varying doping of front and back gate polysilicon material, utilizing materials of differing workfunction for the two gate electrodes, and grading of the channel doping between the two gate regions or introduction of impurities (e.g., cesium) into the gate of one of the FETs to either raise or lower local threshold voltage.

Regardless of whether a double gate FET has symmetric or asymmetric characteristics (in terms of front and back side conductivity), double gate FETs may also be constructed using either planar techniques or FIN techniques. In planar techniques, the structure of FIG. 4 or 5 may be envisioned as being formed on the surface of a semiconductor substrate, which may be silicon or other material. The back gate and back gate oxide of the device would be located at the bottom of the device stack, with the source, channel, drain regions stacked above the back gate, and topped by the front gate structure. Alternatively, in FIN techniques, the device regions of the structure of FIG. 4 would represent top-down views. That is, all regions of the double gate device are built above the substrate, with the width of the device being defined as the height of the top of the gate, oxide and channel regions above the substrate and the source/drain regions rising above the substrate at opposite ends of the channel region.

Referring once again to FIG. 2, the cross coupled transistor devices (P1, N1, P2, N2) of each SRAM cell 202 may be wired such that both the front and back gate of each device is actively driven, or may alternatively be wired such that only one of the front or back gate is actively driven while the opposing gate is tied inactive. As stated above, the transfer gates (NL, NR) of the SRAM cell 202 are implemented using dual gate devices, in which one of the two gate nodes in each device is driven by a wordline signal (WL) that is active during both read and write operations of the cell, while the second gate node is driven by a back gate write signal (BGW) that is only active during a write operation. The two gates of the access transistors may be symmetrical or, alternatively, may be made asymmetrical through any of the techniques described above. As a result of the transfer gate topology and operation, the impedance of the transfer gate is made lower during write operations to provide a high performance write to the cell. During read operations, the impedance of the transfer gate is increased to provide for cell stability.

As will thus be appreciated, the invention embodiments described herein provide a single port SRAM cell utilizing six dual gate FETs which exhibit different transfer gate characteristics for read and write operations, as well as a method for accessing the cell. In a first embodiment, one of the two wordlines which drives the transfer gates is activated for both a read and write operation and the second wordline is only driven in during a write operation. In a second embodiment, one of the two wordlines is driven only during read with the alternate wordline only driven during write. The wordlines may be driven digitally, or with an analog bias.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A static random access memory (SRAM) device, comprising:
    a pair of cross-coupled, complementary metal oxide semiconductor (CMOS) inverters configured as a storage cell for a bit of data; and
    a first pair of transfer gates configured to couple storage cell nodes of the storage cell to a corresponding pair of bitlines during a read operation of the device; and
    a second pair of transfer gates configured to couple the storage cell nodes to the pair of bitlines during a write operation of the device;
    wherein impedance between the bitlines and the storage cell nodes during the write operation is less than that for the read operation.

2. The SRAM device of claim 1, wherein:
    the first pair of transfer gates is also configured to couple the storage cell nodes to the pair of bitlines during the write operation of the device; and
    the second pair of transfer gates is configured to couple the storage cell nodes to the pair of bitlines only during a write operation of the device.

3. The SRAM device of claim 2, wherein the first and second pairs of transfer gates are each implemented within a single pair of dual gate access transistors configured to selectively couple the storage cell nodes to the pair of bitlines.

4. The SRAM device of claim 3, wherein the first pair of transfer gates corresponding to the dual gate access transistor is coupled to a wordline control signal activated during both the read and write operations.

5. The SRAM device of claim 4, wherein the second pair of transfer gates corresponding to the dual gate access transistor is coupled to a back gate write signal activated only during the write operation.

6. The SRAM device of claim 5, wherein the back gate write signal comprises an analog signal.

7. The SRAM device of claim 6, wherein the back gate signal is variably biased for device isolation at a first voltage level, performing a read operation at a second voltage level and performing a write operation at a third voltage level.

8. The SRAM device of claim 5, wherein the back gate write signal comprises a digital signal.

9. The SRAM device of claim 3, wherein the dual gate access transistors comprise symmetrical front and back gates.

10. The SRAM device of claim 3, wherein the dual gate access transistors comprise asymmetrical front and back gates.

11. The SRAM device of claim 3, wherein the dual gate access transistors comprise a FINFET configuration.

12. The SRAM device of claim 1, wherein:
    the first pair of transfer gates is configured to couple the storage cell nodes to the pair of bitlines only during the read operation of the device; and
    the second pair of transfer gates configured to couple the storage cell nodes to the pair of bitlines only during a write operation of the device.

13. A static random access memory (SRAM) array, comprising:
    a plurality of SRAM storage cells arranged in rows and columns, each of the storage cells further comprising a pair of cross-coupled, complementary metal oxide semiconductor (CMOS) inverters, a first pair of transfer gates configured to couple storage cell nodes of the storage cell to a corresponding pair of bitlines during both a read and write operation of the device, and a second pair of transfer gates configured to couple the storage cell nodes to the pair of bitlines only during the write operation of the device, wherein impedance between the bitlines and the storage cell nodes during the write operation is less than that for the read operation;
    the first and second pairs of transfer gates each implemented within a single pair of dual gate access transistors configured to selectively couple the storage cell nodes to the pair of bitlines; and
    the second pair of transfer gates corresponding to the dual gate access transistor is coupled to a back gate write signal, wherein control lines for the back gate write signals are routed in parallel with the cell bitlines.

14. The SRAM array of claim 13, wherein the dual gate access transistors comprise a single channel region configured to operate in a fully depleted mode such that a back gate bias thereof enhances device conductivity with respect to activation of only a front gate signal.

15. The SRAM array of claim 14, wherein the back gate write signal comprises a digital signal.

16. The SRAM array of claim 14, wherein the back gate write signal comprises an analog signal.

17. The SRAM array of claim 16, wherein the back gate signal is variably biased for device isolation at a first voltage level, performing a read operation at a second voltage level and performing a write operation at a third voltage level.

* * * * *